United States Patent [19]

Matsuoka

[11] Patent Number: 4,715,835
[45] Date of Patent: Dec. 29, 1987

[54] IC PACKAGE CARRIER

[75] Inventor: Noriyuki Matsuoka, Tokyo, Japan

[73] Assignee: Yamaichi Electric Mfg. Co., Ltd., Tokyo, Japan

[21] Appl. No.: 869,605

[22] Filed: Jun. 2, 1986

[30] Foreign Application Priority Data

Jun. 3, 1985 [JP] Japan .............................. 60-120000

[51] Int. Cl.$^4$ ........................ H01R 9/09; B65D 85/42
[52] U.S. Cl. .................................... 439/893; 206/328; 439/331
[58] Field of Search .......... 339/17 CF, 75 M, 75 MP; 206/328, 331, 332, 334

[56] References Cited

U.S. PATENT DOCUMENTS

| D. 202,937 | 11/1965 | Foshee et al. | 174/52 FP |
| 3,353,656 | 11/1967 | Brown | 206/328 X |
| 3,615,006 | 10/1971 | Freed | 206/328 X |
| 4,007,479 | 2/1977 | Kowalski | 174/52 FP |
| 4,329,642 | 5/1982 | Luthi et al. | 206/328 X |
| 4,331,373 | 5/1982 | Demnianiuk | 339/17 CF |
| 4,422,547 | 12/1983 | Abe et al. | 206/328 |
| 4,535,887 | 8/1985 | Egawa | 206/328 |

OTHER PUBLICATIONS

IBM Technical Disclosure Bulletin, Jarrela, vol. 16, No. 12, May 1974.

Primary Examiner—Neil Abrams
Attorney, Agent, or Firm—Wenderoth, Lind & Ponack

[57] ABSTRACT

A carrier for an IC package having a plurality of IC leads projecting in parallel sidewise from at least two lateral side surfaces thereof comprises a carrier substrate including a section for accommodating the IC package therein and a plurality of grooves formed in the central surface of the carrier substrate for accommodating therein the IC leads and supporting the lower surfaces of the IC leads on the bottoms thereof when the IC package has been accommodated in the section. Also included is an IC package support detachably mounted at a position on the carrier substrate, disengageably engaged at another position with the carrier substrate and comprising at least two IC lead retaining bars which are disposed so as to engage the upper surfaces of the IC leads for retaining against the lower surfaces of the bars the upper surfaces of the IC leads when the IC package support has been engaged with the carrier substrate having the IC package accommodated in the section thereof.

2 Claims, 10 Drawing Figures

IC PACKAGE CARRIER

FIELD OF THE INVENTION AND RELATED ART STATEMENT

The present invention relates to the construction of an IC package carrier and particularly to a carrier for a flat IC package having IC leads projecting in parallel from the side surfaces thereof.

There have heretofore been proposed various IC package carriers of this type. For example, U.S. Pat. Nos. 3,529,277 and 3,652,974 disclose one-piece type IC package carriers. Since one-piece type carriers can be molded integrally from a plastic material and can inexpensively be manufactured, they have found widespread acceptance. However, since they have a construction such that a carrier substrate has an IC package accommodation section which is provided at suitable places thereof with a plurality of catch claws and such that the catch claws are urged outwardly by forcing an IC package into the accommodation section and allowed to restore to their initial state due to their resiliency as soon as the IC package has been set in position to thereby engage with the periphery of the IC package, the catch claws have to be urged outwardly again under a condition where the finger tips grasping the catch claws to extract the IC package from the accommodation section. This operation is very troublesome. Further, as the support of the IC package relies solely on the engagement between the catch claws and the periphery of the IC package, the reliability in strength for supporting the IC package is not high. In addition, the catch claws are liable to be damaged or broken down due to repeated attachment and detachment of IC packages. If the catch claws are formed to be large in size in order to make the IC package extracting operation easy and avoid damage or breakdown of the catch claws, they have a large bulk and project outwardly. In this case, therefore, the large-sized catch claws prove a serious hindrance to the accumulation of the carriers.

On the other hand, there have heretofore been also proposed two-piece type carriers comprising a carrier substrate and a retaining member. Generally, the two-piece type carriers require a space occupied by the retaining member and are therefore liable to be large in size as a whole.

Since carriers are attached, as carrying an IC package thereon, to an IC socket to obtain electrical connection between the IC package and the IC socket, the side of the carriers, on which IC leads of the IC package come into contact with contacts of the IC socket, is required to be open, and the opposite side thereof is preferably open so as to allow the heat generated by the electrical contact to radiate. On the other hand, there is an increasing tendency to pitch fineness of IC leads projecting from at least two sides of IC packages. Under these circumstances, in supporting the IC package on the conventional carrier, it is necessary that the catch claws be interposed between the IC leads having a fine pitch and engaged with the peripheral edge of the IC package or that the catch claws be disposed at narrow spaces of the IC package between the groups of IC leads projecting from adjacent side surfaces of the IC package and engaged with the corner edges of the IC package. Therefore, conventional carriers entail some restrictions on and difficulty in the design and production of a mechanism for carrying the IC package thereon and suffer instability in the carrying function.

OBJECT AND SUMMARY OF THE INVENTION

The main object of the present invention is to provide an IC package carrier simple in construction and capable of effectively eliminating the aforementioned conventional drawbacks, reliably retaining an IC package with exactitude and fulfilling the recent desirability of reduction in size and thickness of the IC package.

To attain the object described above, according to the present invention, there is provided a carrier for an IC package having a plurality of IC leads projecting in parallel sidewise from at least two lateral side surfaces thereof, which comprises a carrier substrate including a section for accommodating the IC package therein and a plurality of grooves formed in the upper surface of the carrier substrate for accommodating therein the plurality of IC leads and supporting the lower surfaces of the plurality of IC leads on the bottoms thereof when the IC package has been accommodated in the section, and IC package supporting means detachably mounted at a position on the carrier substrate, disengageably engaged at another position with the carrier substrate and comprising at least two IC lead retaining bars which are disposed so as to intersect the upper surfaces of the plurality of IC leads for retaining on the lower surfaces thereof the upper surfaces of the plurality of IC leads when the IC package supporting means has been engaged with the carrier substrate having the IC package accommodated in the section thereof.

The above and other objects, characteristic features and advantages of the present invention will become apparent to those skilled in the art as the disclosure is made in the following description of preferred embodiments of the invention, as illustrated in the accompanying drawings.

DETAILED DESCRIPTION OF THE PREFERRED EMBODIMENTS

The present invention will not be described in detail with reference to the illustrated embodiments.

Figure 10:
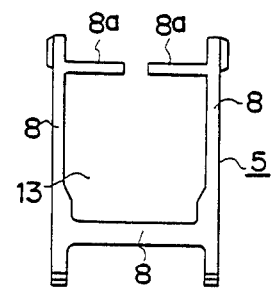
FIG. 10 is a plan view illustrating another example of the IC package supporting means usable in the present invention.

FIG. 1 through FIG. 9 illustrate one embodiment of the IC package carrier according to the present invention, which is of a two-piece type. FIG. 10 illustrates an example of IC package supporting means usable in the present invention.

Reference numeral 1 designates a carrier substrate made of a synthetic resin and having an opening formed, as an IC package accommodation section 4, in the central portion thereof and a plurality of partition walls 3 formed on the upper surface thereof as projecting upwardly and extending in parallel along the upper surface around the accommodation section 4 in four directions so as to define between adjacent ones IC lead accommodating grooves 2 having their bottoms flush with the upper surface. Denoted by numeral 10 is a flat IC package which has a plurality of IC leads 11 projecting in parallel sidewise from the four lateral side surfaces thereof. When the IC package 10 has been accommodated in the accommodation section 4 of the carrier substrate 1, the IC leads 11 are accommodated one each in the accommodating grooves 2, located by the partition walls 3 and supported on the bottoms of the accommodating grooves 2.

If an IC package 10 to be retained has a plurality of IC leads 11 projecting in parallel sidewise from two of the four lateral side surfaces thereof, the carrier substrate 1 may have partition walls 3 for defining accommodating grooves 2 arranged on two of the four sides of the section 4 so as to correspond to the positions of the IC leads 11.

Reference numeral 5 designate IC package supporting means made of an insulating material such as a synthetic resin and comprising a plurality of IC lead retaining bars 8 which define a window 13 for exposing the IC package 10 to the outside and which extend each as intersecting the groups of IC leads 11 projecting in parallel sidewise from the lateral side surfaces of the IC package 10 to retain the upper surfaces of the IC leads 11 at their lower surfaces. The carrier substrate 1 has a fitting section 14 defined by the end faces of the partition walls 3, upper surface of the carrier substrate 1 and IC package accommodation section 4 for fitting therein the IC package supporting means 5. Engaging means are provided respectively on the IC package supporting means 5 and the carrier substrate 1 so that the IC package supporting means 5 may be fitted in the fitting section 14 and detachably engaged with the carrier substrate 1. For instance, a latch mechanism or a projection-to-hole close fitting mechanism may optionally be adopted as the engaging means.

When the IC package 10 has been set in position within the accommodation section 4 of the carrier substrate 1, the IC leads 11 projecting from the lateral side surfaces of the IC package 10 have their base portions supported on the upper surface of the carrier substrate 1 defining the fitting section 14 and their leading portions accommodated in the accommodating grooves 2 defined between the partition walls 3. The IC lead retaining bars 8 constituting the IC package supporting means 5 are fitted in the fitting section 14 as intersecting the base portions of the IC leads 11 supported on the upper surface of the carrier substrate 1 defining the fitting section 14, and are engaged with the carrier substrate 1. Therefore, the base portions of the IC leads 11 are clamped as a unit between the lower surfaces 9 of the IC lead retaining bars 8 and the upper surface of the carrier substrate 1. Thus, the IC package 10 is carried on the carrier substrate 1.

The IC package 10 can be carried on the carrier substrate 1 by retaining one of the two pairs of opposite IC leads 11 projecting from the four lateral side surfaces of the IC package 10 with the IC package supporting means 5. Therefore, the IC package supporting means 5 may comprise at least two IC lead retaining bars 8. In other words, the IC leads 11 projecting from the four lateral side surfaces of the IC package 10 may be retained by the IC package supporting means 5 having three or four IC lead retaining bars 8.

Further, the fitting section 14 may be formed by cutting grooves (not illustrated) in the partition walls 3 so as to intersect the partition walls 3. In this case, the IC lead retaining bars 8 are accommodated in the grooves and restrained by the end faces of the walls 3 across the grooves.

Figure 1:
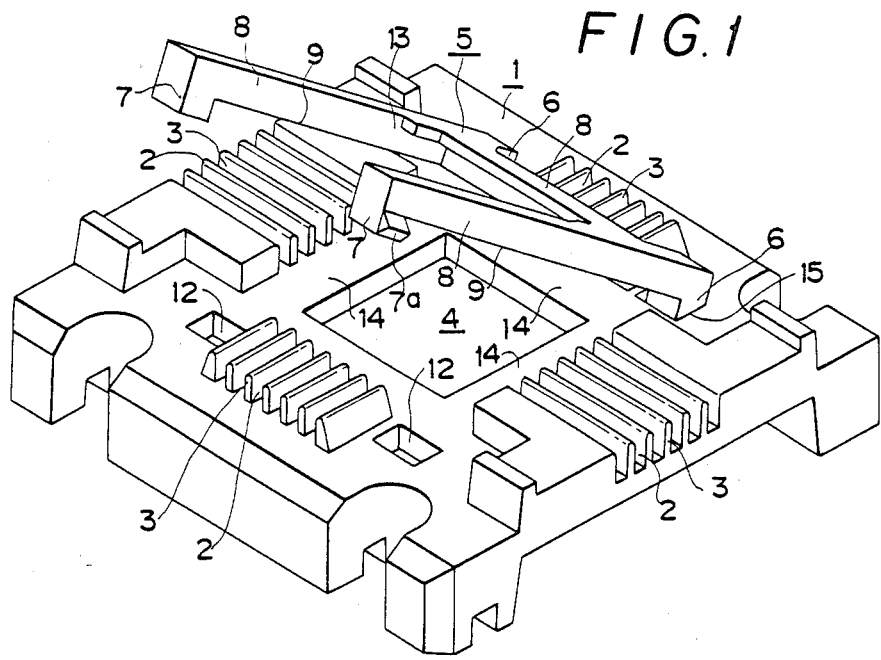
FIG. 1 is a perspective view illustrating one embodiment of the IC package carrier according to the present invention, with IC package supporting means mounted on and disengaged from a carrier substrate.
Figure 2:
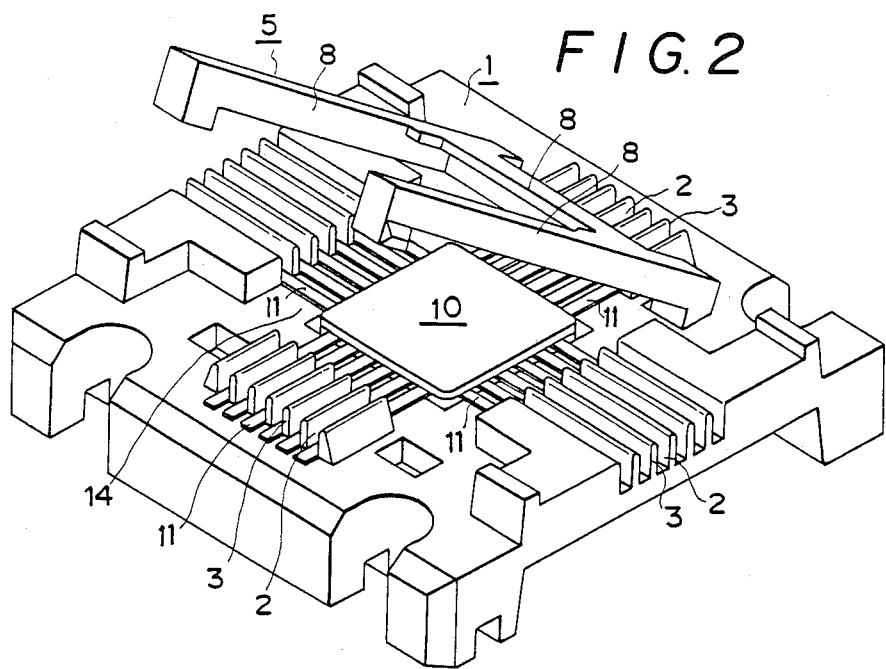
FIG. 2 is a perspective view illustrating the IC package carrier of FIG. 1, with an IC package accommodated in a section of the carrier substrate.
Figure 3:
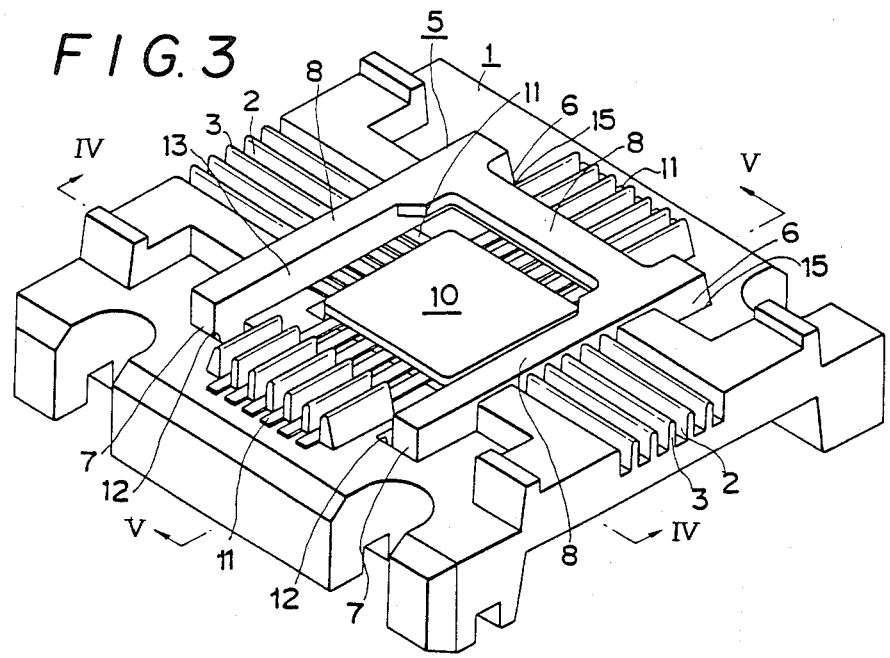
FIG. 3 is a perspective view illustrating the same IC package carrier, with the IC package accommodated in the section and the IC package supporting means engaged with the carrier substrate.
Figure 4:
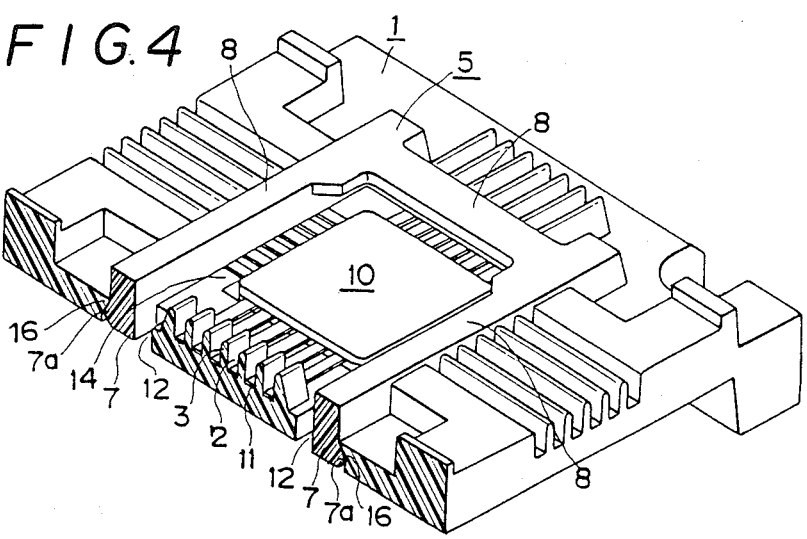
FIG. 4 is a perspective view, partly in section taken along line IV—IV in FIG. 3, illustrating the same IC package carrier.
Figure 5:
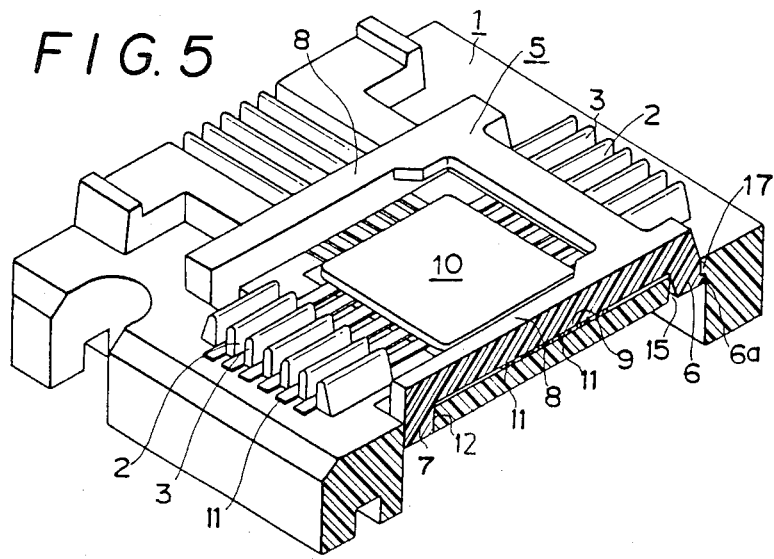
FIG. 5 is a perspective view, partly in section taken along line V—V in FIG. 3, illustrating the same IC package carrier.
Figure 6:
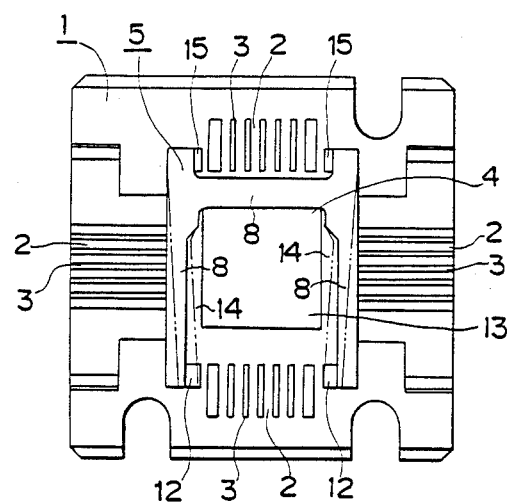
FIG. 6 is a plan view illustrating the same IC package carrier, with the IC package supporting means mounted on and engaged with the carrier substrate.
Figure 7:
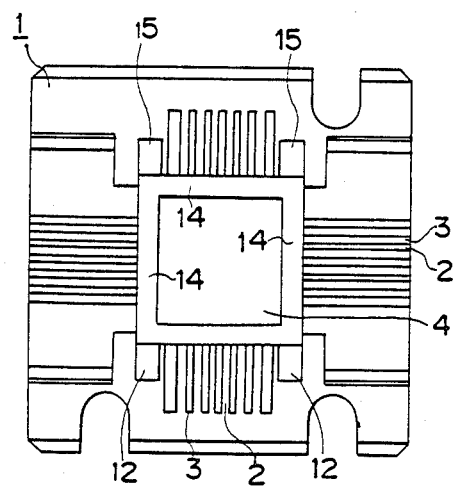
FIG. 7 is a plan view illustrating the carrier substrate of the same IC package carrier.
Figures 8, 9:
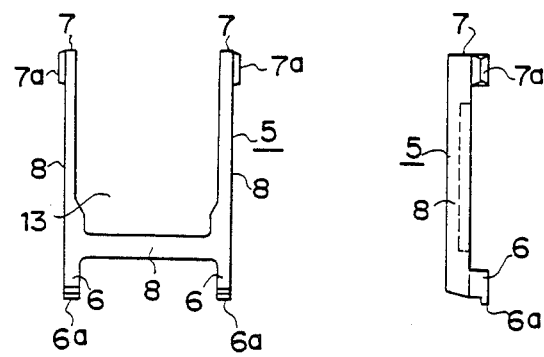
FIG. 8 is a plan view illustrating the IC package supporting means of the same IC package carrier.
FIG. 9 is a side view illustrating the IC package supporting means of the same IC package carrier.

Returning to FIG. 1 through FIG. 9 illustrating one embodiment of the IC package carrier according to the present invention, the carrier substrate 1 and the IC package supporting means 5 are molded separately. The carrier substrate 1 has engaging holes 12 formed therein on the opposite sides of one group of partition walls 3 so as to have stopper edges 16 formed in the inner walls thereof as illustrated in FIG. 4 and also has engaging holes 15 formed therein on the opposite sides of another group of partition walls 3 opposed to the aforementioned one group of partition walls 3 across the accommodation section 4 so as to have stopper edges 17 formed in the inner walls thereof as illustrated in FIG. 7. On the other hand, the IC package supporting means 5 is formed of three IC lead retaining bars 8; i.e. a pair of parallel bars 8 and a bar 8 connecting the pair of parallel bars 8. Each of the parallel bars 8 has its base end provided with an engaging pawl 6 having a pawl piece 6a which is engaged with the stopper edge 17 of the engaging hole 15 and also has its free end provided with another engaging pawl 7 having a pawl piece 7a which is engaged with the stopper edge 16 of the engaging hole 12. The IC package supporting means 5 is detachably mounted on the carrier substrate 1 by inserting the engaging pawls 6 of the IC lead retaining bars 8 into the engaging holes 15 and engaging the pawl pieces 6a which project in the lengthwise direction of the bars 8 with the stopper edges 17, whereby the IC package supporting means 5 can be rotated about the engaged portions toward and away from the upper surface of the carrier substrate 1. The pawl pieces 7a projecting outwardly in the width direction of the bars 8 are engaged with the stopper edges 16 by rotating the IC package supporting means 5 toward the upper surface of the carrier substrate 1, inserting the engaging pawls 7 into the engaging holes 12 while flexing the pair of parallel bars 8 inwardly, and allowing the pair of parallel bars 8 to restore to their initial state, and are disengaged from the stopper edges 16 by reversing the procedures described above, as illustrated in FIG. 6. In this embodiment, the bar 8 connecting the pair of parallel bars 8 may have the same function as that of the pair of parallel bars 8, i.e. may serve to retaining one group of IC leads 11 on the lower surface thereof, or may serve to merely connect the pair of parallel bars 8.

FIG. 10 illustrates another example of the IC package supporting means 5 usable in the present invention. In this example, the pair of parallel bars 8 of the preceding embodiment are provided integrally with IC lead retaining pieces 8a which project inwardly from the inner side surfaces thereof toward each other, with the facing distal edges thereof intervening therebetween a space permitting the inward flexing of the pair of parallel bars 8. According to the IC package supporting means 5, therefore, four groups of IC leads 11 projecting from the four lateral side surfaces of the IC package 10 can be retained en bloc by the three IC lead retaining bars 8 and two IC lead retaining pieces 8a. Optionally, the IC lead retaining pieces 8a may be formed such that they are displaced in height or phase insofar as they permit inward flexing of the pair of parallel bars 8.

According to the present invention, as described above, since IC lead retaining bars are mounted on and engaged with the carrier substrate so as to intersect the upper surfaces of the IC leads of the IC package and clamp the IC leads en bloc in conjunction with the upper surface of the carrier substrate, the IC package can reliably be carried on the carrier substrate with high exactitude.

When the IC package is accommodated in the IC package accommodation section of the carrier substrate, the IC leads extend from the side surfaces of the IC package to the IC lead accommodating grooves defined by the partition walls of the carrier substrate. Each of the IC leads thus set in place is brought into contact with a contact of an IC socket at a mere one point thereof. Therefore, the remaining portion of the IC lead has nothing to do with electrical connection with the contact. The present invention makes use of the remaining portion of the IC lead in retaining the IC package on the carrier substrate and makes it possible to clamp the IC leads as a unit between the IC lead retaining bars and the carrier substrate within a narrow region of lines intersecting the IC leads.

Further, the IC retaining bars can be made thin and brought into intimate contact with the carrier substrate and, therefore, the present invention can contribute to reduction in size and thickness of IC package carriers. In addition, as the position for retaining the IC leads with the IC lead retaining bars can be the base ends of the IC leads exhibiting the largest strength, the IC package can firmly be carried on the carrier substrate.

Furthermore, as the IC package supporting means is composed of a plurality of simple bars, the IC package carrier has a simple construction as a whole. Thus, the IC package carrier of the present invention can precisely carry an IC package thereon without applying load onto the IC package and without entailing the restrictions on and difficulty in the design and production suffered by the conventional IC package carriers.

What is claimed is:

1. A carrier of an IC package having a plurality of IC leads projecting in parallel sidewise from at least two lateral side surfaces thereof, which comprises:

a carrier substrate including a section for accommodating the IC package therein and a plurality of grooves formed in at least two lateral side portions of the upper surface of said carrier substrate for accommodating therein the plurality of IC leads and supporting the lower surfaces of the plurality of IC leads on the bottoms thereof when the IC package has been accommodated in said section;

IC package supporting means hingedly mounted for rotation at a position on said carrier substrate, disengageably engaged at another position with said carrier substrate and comprising at least two IC lead retaining bars which extend along said two lateral side portions and engage the upper surfaces of the plurality of IC leads for retaining against the lower surfaces of the bars the upper surfaces of the plurality of IC leads when said IC package supporting means has been engaged with said carrier substrate having the IC package accommodated in said section thereof;

said at least two IC lead retaining bars having free outer ends, said free outer ends of said bars having engaging pawls, and said free outer ends being elastically shiftable toward and away from each other; and said upper surface of said carrier substrate has engaging means for engaging said pawls and for shifting said free outer ends of said bars toward each other when said bars are rotated against the upper surface of said carrier substrate, whereby said pawls of said free outer ends are engageable and disengageable with said carrier substrate for retaining the IC package.

2. The IC package carrier of claim 1, wherein the free outer ends of said at least two IC lead retaining bars further comprise inwardly extending IC lead retaining pieces.

* * * * *